(12) United States Patent
Terahara et al.

(10) Patent No.: US 8,039,358 B2
(45) Date of Patent: Oct. 18, 2011

(54) METHOD OF MANUFACTURING SEMICONDUCTOR DEVICE ON WHICH A PLURALITY OF TYPES OF TRANSISTORS ARE MOUNTED

(75) Inventors: Masanori Terahara, Kawasaki (JP); Masaki Nakagawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/053,089

(22) Filed: Mar. 21, 2008

(65) Prior Publication Data
US 2008/0237812 A1     Oct. 2, 2008

(30) Foreign Application Priority Data
Mar. 30, 2007   (JP) .................................. 2007-090775

(51) Int. Cl.
*H01L 21/76* (2006.01)
(52) U.S. Cl. ................... 438/425; 438/647; 257/E21.54
(58) Field of Classification Search ............... 257/647, 257/E21.54; 438/425, 246, 248, 426, 647
See application file for complete search history.

(56) References Cited

U.S. PATENT DOCUMENTS

| | | | | |
|---|---|---|---|---|
| 5,960,299 A | * | 9/1999 | Yew et al. ..................... | 438/424 |
| 2003/0100166 A1 | * | 5/2003 | Pividori ........................ | 438/424 |
| 2005/0227440 A1 | * | 10/2005 | Ema et al. ..................... | 438/275 |
| 2006/0040462 A1 | * | 2/2006 | Wu et al. ....................... | 438/424 |
| 2006/0189092 A1 | * | 8/2006 | Sato et al. ..................... | 438/424 |
| 2007/0065731 A1 | * | 3/2007 | Ishiwata ........................ | 430/5 |

FOREIGN PATENT DOCUMENTS

| | | | |
|---|---|---|---|
| JP | 2001-024055 A | | 1/2001 |
| JP | 2004-186551 A | | 7/2004 |
| KR | 1020050002089 | * | 1/2005 |
| KR | 10-2005-0069519 A | | 7/2005 |

OTHER PUBLICATIONS

Korean Office Action dated Oct. 18, 2010, issued in corresponding Korean Patent Application No. 10-2008-0028928.
Korean Office Action dated Sep. 14, 2010, issued in corresponding Korean Patent Application No. 10-2010-0056228.

* cited by examiner

*Primary Examiner* — Thanh V Pham
*Assistant Examiner* — Duy Nguyen
(74) *Attorney, Agent, or Firm* — Westerman, Hattori, Daniels & Adrian, LLP

(57) ABSTRACT

A method of manufacturing a semiconductor device includes the steps of forming a trench on a semiconductor substrate to define a first and a second element regions; burying a first oxide film in the trench; forming a second oxide film on surfaces of the first and second element regions; performing a first ion doping using a first mask which is exposing a first region containing the first element region and a part of the first oxide; performing a second ion doping using a second mask which is exposing a second region containing the second element region and a part of the first oxide film; and removing the second oxide film formed in the first element region and the second element region by etching, and the first oxide film is selectively thinned using the first or second mask after performing the first or second ion doping.

4 Claims, 21 Drawing Sheets

METHOD OF MANUFACTURING SEMICONDUCTOR DEVICE ON WHICH A PLURALITY OF TYPES OF TRANSISTORS ARE MOUNTED

CROSS-REFERENCE TO RELATED APPLICATIONS

This application is based upon and claims the benefit of priority from the prior Japanese Patent Application No. 2007-90775, filed on Mar. 30, 2007, the entire content of which is incorporated herein by reference.

TECHNICAL FILED

This invention relates to a method of manufacturing a semiconductor device on which a plurality of types of transistors are mounted and the semiconductor device

BACKGROUND OF THE INVENTION

In a manufacturing process of a semiconductor device including transistors, i.e., MOS transistors, oxide films (hereinafter referred to as "sacrifice oxide film") may be deposited on surfaces of element regions in order to prevent damage to a semiconductor substrate by well implementation or channel implementation.

The sacrifice oxide film is removed with chemical solution, i.e., hydrofluoric acid (HF) prior to forming a gate insulator. However, a chemical solution such as HF also etches the oxide film for demarcation of the element regions (hereinafter referred as to "buried oxide film"), thus the buried oxide film differs in height after removing the sacrifice oxide film compared to before removing the sacrifice oxide film.

Japanese Laid-open Patent Publication 2001-24055 discloses a planarization technology for the buried oxide film, i.e., a method for leveling the buried oxide film protruded from the surface of the element region to the element region's height. With this approach, firstly, an oxide film (hereinafter referred as to "thermal oxidized film") is formed on the surface of the element region by thermal oxidation method. Then, the buried oxide film and the thermal oxidized film are coated with photoresist. Thereafter, the thermal oxidized film is exposed by etching the photoresist and the buried oxide film at an even rate. Next, the buried oxide film and the thermal oxidized film are etched by wet etching at the even rate to expose the element regions. Thus the buried oxide film is leveled to the element region in height.

The etching rate of the buried oxide film with the chemical solution such as HF differs according to the type of implemented ion, an amount of the ion's atomic weight or implementation dosage. As such, where plural types of transistors are implemented together, the etching rates of the buried oxide film vary by region of a semiconductor substrate. Thus, where the sacrificed oxide film is removed with the chemical solution such as HF after well/channel implementation, the surface of the buried oxide film may be unleveled.

SUMMARY

According to an aspect of an embodiment, a method of manufacturing a semiconductor device includes the steps of: forming a trench on a semiconductor substrate to define a first element region and a second element region; burying a first oxide film in said trench; forming a second oxide film on surfaces of said first and second element regions; performing a first ion doping using a first mask which is exposing a first region containing said first element region and a part of said first oxide; performing a second ion doping using a second mask which is exposing a second region containing said second element region and a part of said first oxide film; and removing said second oxide film formed in said first element region and said second element region by etching, wherein said first oxide film is selectively thinned using said first or second mask after performing said first or second ion doping.

According to an another aspect of an embodiment, a method of manufacturing a semiconductor, comprising the steps of: forming a trench on a semiconductor substrate to define a plurality of element regions; burying a first oxide film in said trench; forming a second oxide on surfaces of said plurality of element regions; performing ion doping to said plurality of element regions; forming a third oxide film on said first oxide film after performing ion doping to said element regions; and removing said second oxide film by etching after forming said third oxide on said first oxide.

According to a further aspect of an embodiment, a semiconductor device, comprising: a semiconductor substrate where a plurality of element regions are defined with a trench on a surface of said semiconductor substrate; an oxide film buried in said trench; a gate insulator film formed on a surface of a plurality of said element regions; a gate electrode formed on a surface of said gate insulator film, wherein at least a part of said oxide film includes a first layer and a second layer deposited on said first layer with lower density of an ion compared to the first layer.

DETAILED DESCRIPTION OF THE EMBODIMENT

A First Embodiment

[A Method of Manufacturing a Semiconductor Device]

Referring to FIGS. 1-24, the method of manufacturing the semiconductor device in the first embodiment will be discussed precisely here. In FIGS. 1-24, the left side of a vertical wavy line is the first region R1 wherein the first transistor is formed and the right side of the vertical wavy line is the second region R2 wherein the second transistor is formed. In the first embodiment, the first transistor is defined as n-MOS transistor and the second transistor is defined as p-MOS transistor.

Figure 1:
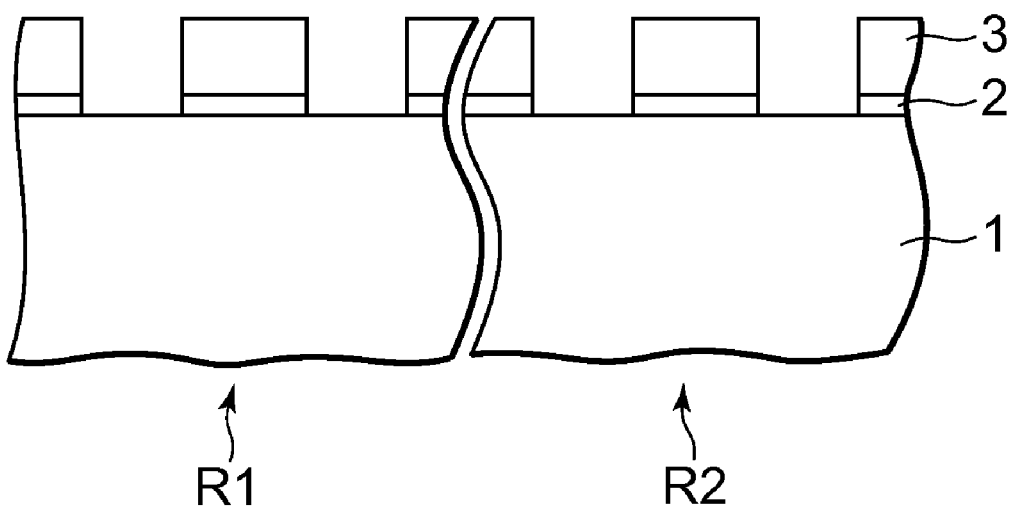
FIGS. 1-24 are illustrations showing the process of manufacturing the semiconductor device in the first embodiment.

As per FIG. 1, firstly, an oxide film 2 is formed on a silicon substrate 1 by thermal oxidation method. A thickness of the oxide film 2 is defined as 10 nm here. Then, a silicon nitride film 3 is deposited by CVD (chemical vapor deposition) method. A thickness of the silicon nitride film 3 is defined as 60-120 nm here. Next, a resist pattern (not illustrated) coats the silicon nitride film 3 by photolithography method. Thereafter, the silicon nitride film 3 and the oxide film 2 are etched using said resist pattern as a mask. After etching the silicon nitride film 3 and the oxide film 2, the resist pattern is removed.

Figure 2:
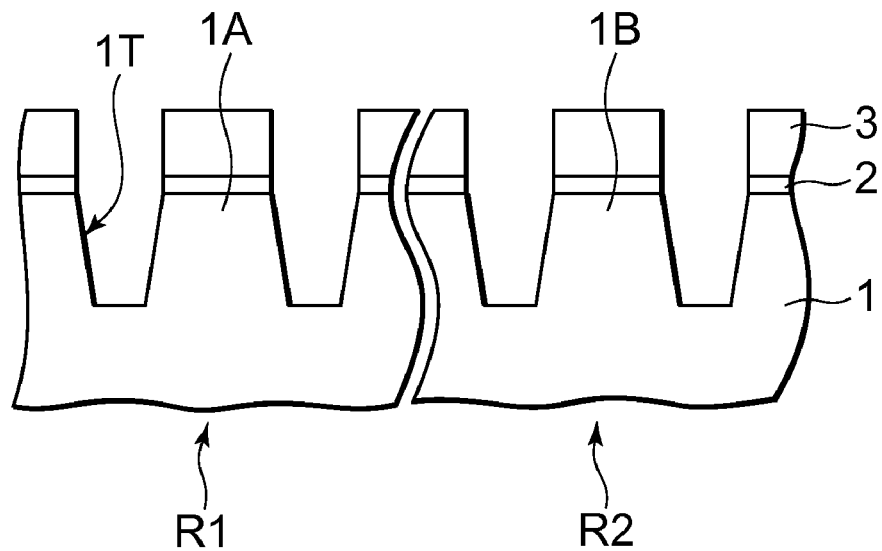
Figure 3:
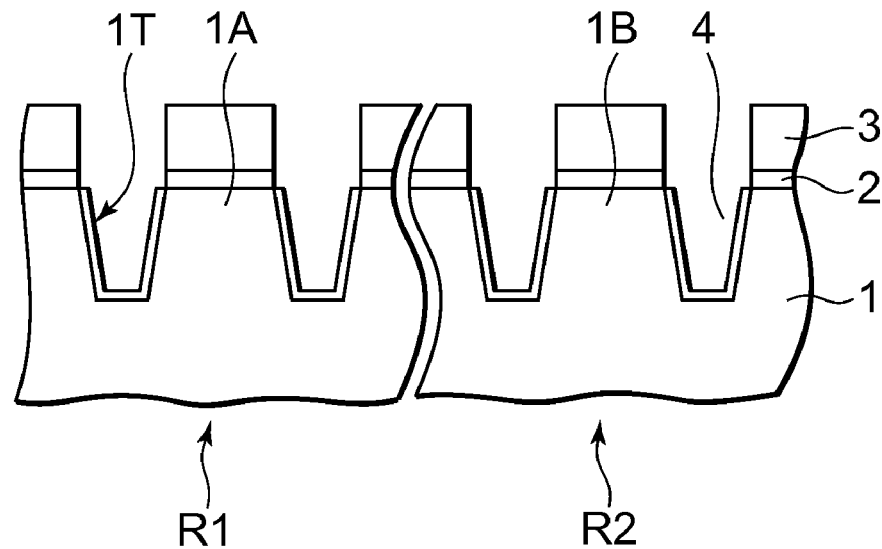

Then, as per FIG. 2, using the silicon nitride film 3 as a mask, the silicon substrate 1 is etched by RIE (reactive ion etching), thereby silicon trench 1T are formed on the silicon substrate 1. The silicon trench 1T defines a plurality of element regions 1A and 1B on the silicon substrate 1. The element regions 1A and 1B are active regions wherein a variety of transistors are formed. A depth of the silicon trench 1T is defined as 200-350 nm here. If necessary, an oxide film 4 can be formed inside of the silicon trench 1T by the thermal oxidation method as per FIG. 3. A thickness of the oxide film 4 is defined on the order of 5 nm here.

Figure 4:
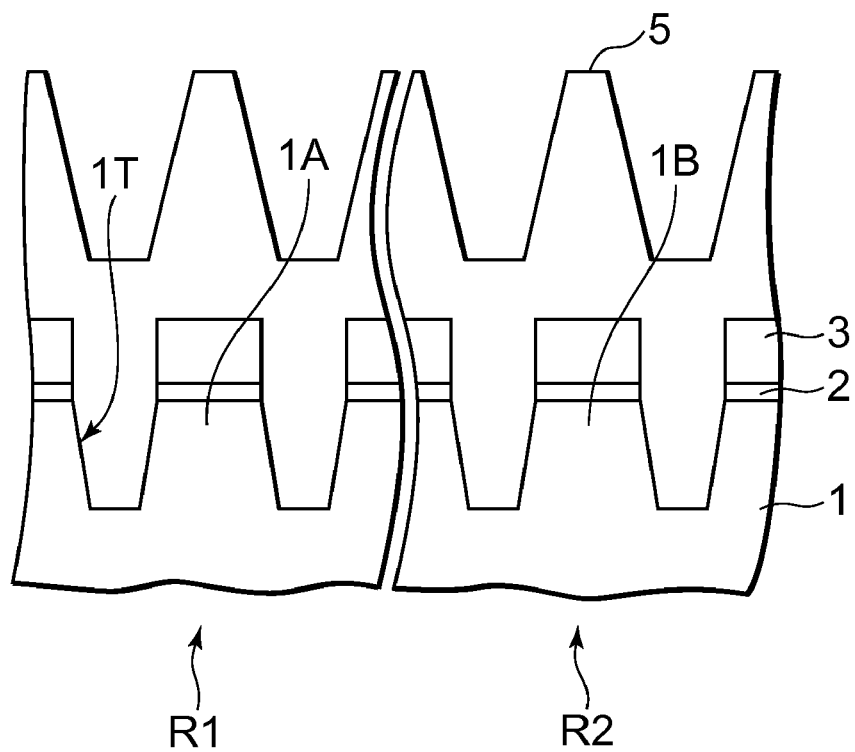

Next, as per FIG. 4, an oxide film 5 is deposited on the silicon trench 1T and the silicon nitride film 3 by, i.e., HDP-CVD (high density plasma chemical vapor deposition), thereby the oxide film 5 is filled in the silicon trench 1T.

Figure 5:
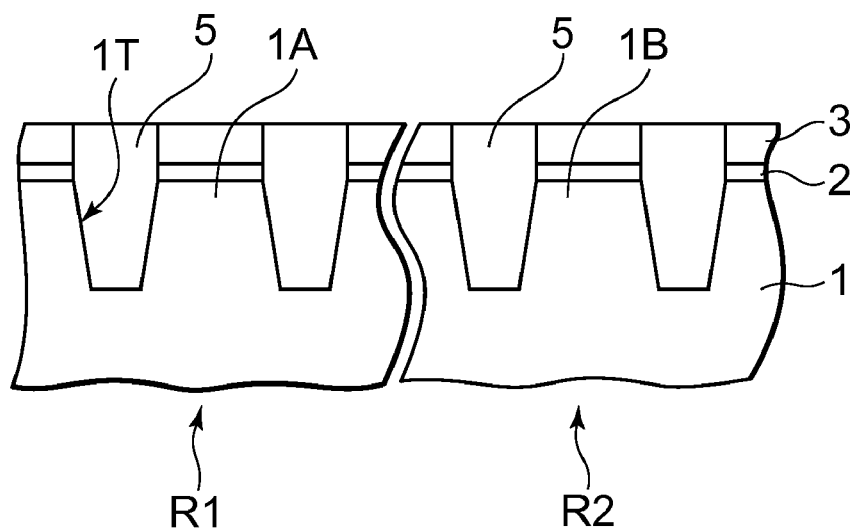

Then, as per FIG. 5, the oxide film 5 is polished by CMP (chemical mechanical polishing). In the first embodiment, using the silicon nitride film 3 as a stopper film, the oxide film 5 is polished until said silicon nitride film 3 is about 60 nm in thickness.

Figure 6:
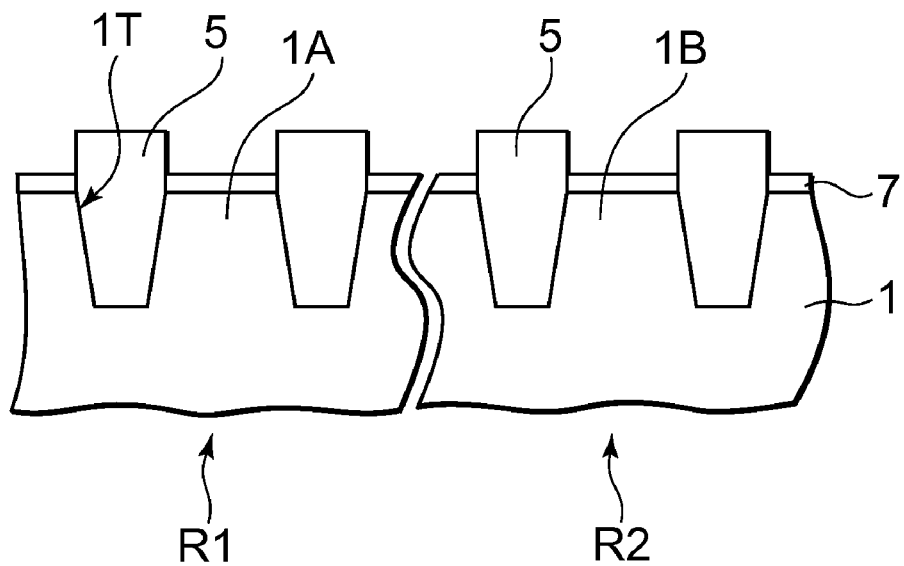

Then, as per FIG. 6, using a chemical solution such as phosphoric acid ($H_3PO_4$), the silicon nitride film 3 is removed by wet etching. Since the silicon nitride film 3 is removed, the oxide 5 is higher than the element regions 1A and 1B. Subsequently, using the chemical such as HF, the oxide 2 is removed by wet etching, and then an oxide film 7 is formed on the surfaces of the element regions 1A and 1B of the silicon substrate 1 by high-temperature anneal at temperatures of 800-1000 degree C., i.e. thermal oxidation method. The oxide film 7 formed by the thermal oxidation method has a denser constitution than the oxide film 5 formed by the HDP-CVD. Therefore, an etching rate of the oxide film 7 with the chemical such as HF is lower than that of the oxide film 5. A thickness of the oxide film 7 is defined as 5-20 nm here. The oxide film 7 is a substantially a sacrifice oxide film, therefore it is removed in a later process with the chemical such as HF.

Figure 7:
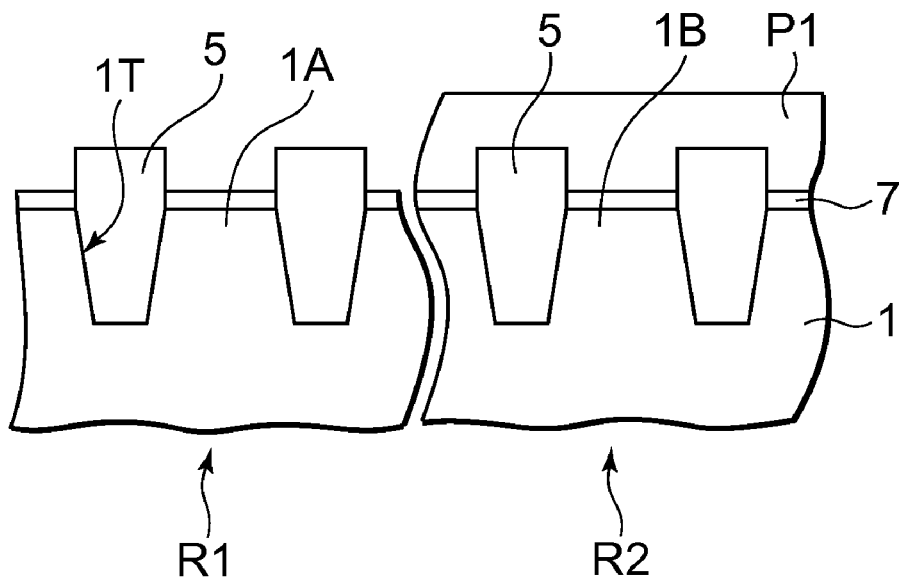

Next, as per FIG. 7, the first resist pattern P1 is formed on the silicon substrate 1 by the photolithography method. The first resister pattern P1 exposes the first region R1 wherein an n-MOS transistor is formed and covers the second region R2 wherein a p-MOS transistor is formed. Using the first resist pattern P1 as a mask, the well implementation and then the channel implementation are done in sequence.

In the first embodiment, $5.0 \times 10^{13}$-$1.0 \times 10^{14}$ cm$^2$ dosage of, i.e., B (boron ion) is doped with the accelerating voltage of 100-300 kev in the well implementation. Subsequently, $1.0 \times 10^{11}$-$1.0 \times 10^{14}$ cm$^2$ of, i.e., B (boron ion) is doped with the accelerating voltage of 5-50 kev, or alternatively, $1.0 \times 10^{11}$-$1.0 \times 10^{14}$ cm$^2$ dosage of In (indium ion) is doped with the accelerating voltage of 20-200 kev in the channel implementation. In the ion implementations, the oxide film 5 formed in the first region R1 are doped with the ion such as B or In as with the element region 1A, thus the etching rate of the oxide film 5 with the chemical such as HF rises.

Figure 8:
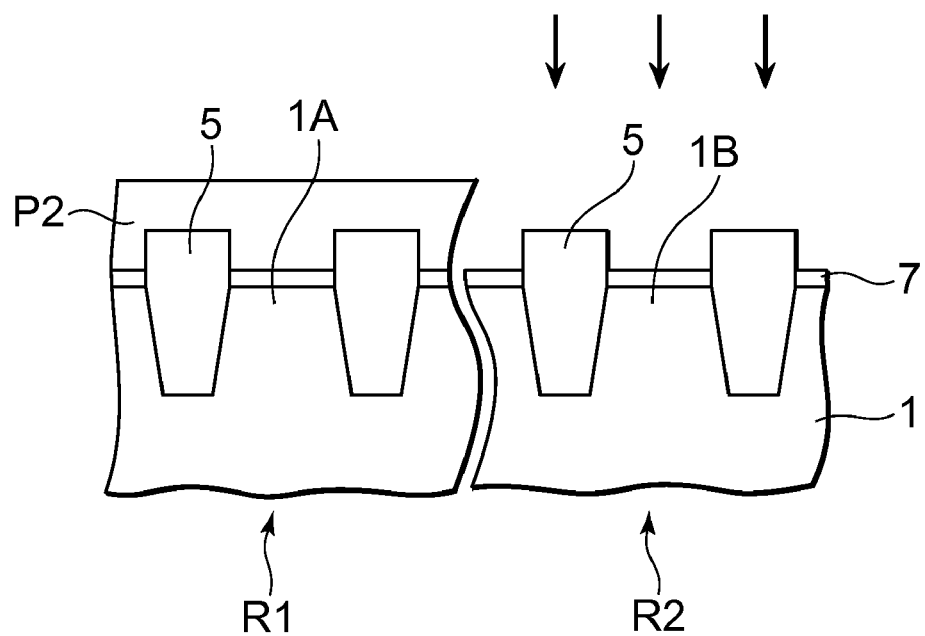

Then, as per FIG. 8, using sulfuric-peroxide-mixture (hereinafter referred to as "SPM"), the first resist pattern P1 is stripped by wet etching. Alternatively, a mixed solution of ammonia and hydrogen peroxide (hereinafter referred to as "ammonia-peroxide-mixture" or "APM") can be used. Thereafter, the second resist pattern P2 is formed on the silicon substrate 1 by the photolithography method. The second resist pattern P2 covers the first region R1 wherein the n-MOS transistor is formed and exposes the second region R2 wherein the p-MOS transistor is formed. Then, using the second resist pattern P2 as a mask, the well implementation and then the channel implementation are subsequently done.

In the first embodiment, $5.0 \times 10^{12}$-$1.0 \times 10^{14}$ cm$^2$ dosage of P (phosphorus ion) is doped with the voltage of 200-900 kev in the well implementation. Subsequently, $1.0 \times 10^{11}$-$1.0 \times 10^{14}$ cm$^2$ dosage of P (phosphorus ion) or As (arsenic ion) is doped with the accelerating voltage of 20-200 kev in the channel implementation. In the ion implementations, the oxide film 5 formed in the second region R2 are doped with the ion such as P or As as with the element region 1B, thereby raised the etching rate of the oxide film 5 with the chemical such as HF. In this regard, the atomic weight of As doped into the oxide film 5 in the second region R2 is smaller that that of In doped into the oxide film 5 in first region R1, thus the etching rate of the oxide film 5 formed in the second region R2 is lower than that of the oxide film 5 formed in the first region R1. Here, the dosage of the ion is not taken into account, however, the etching rate of those oxide film 5 fluctuate with the dosage the ions.

Figure 9:
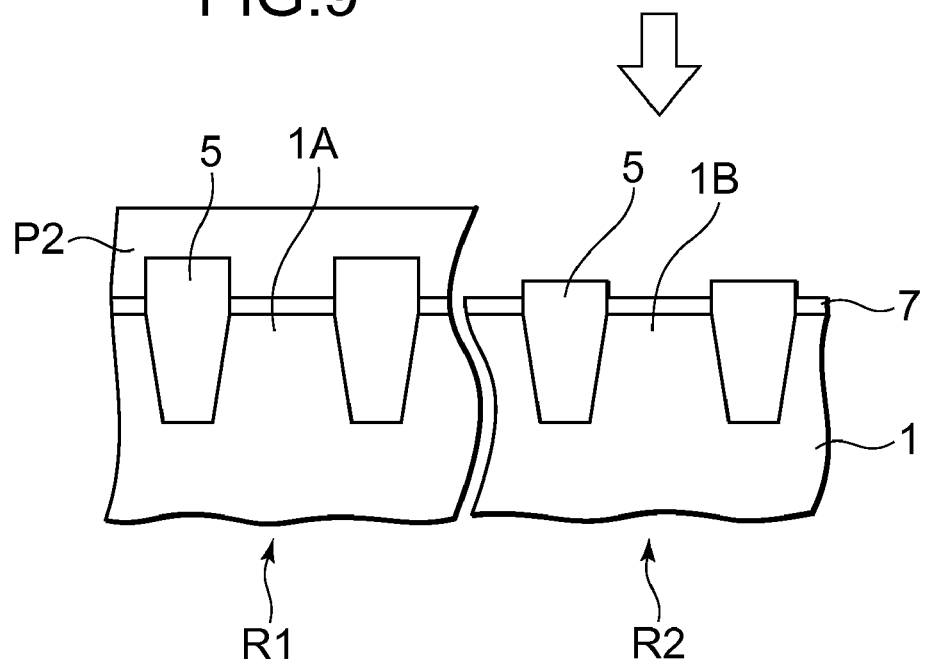

In the first embodiment, as per FIG. 9, using the second resist pattern P2 as a mask, the oxide film 5 formed in the second region R2 are etched by the wet etching using the chemical solution such as HF.

E.g., from prior experiment, it is proven that "where the oxide film 7 are removed with the chemical such as HF, the oxide film 5 in the first region R1 are etched by $\alpha$ and the oxide film 5 in the second region R2 are etched by $\beta$ ($<\alpha$)", the oxide film 5 in the second region R2 should be thinned by $\alpha$-$\beta$. Thus, the heights of the oxide film 5 in the first region R1 and the second region R2 can be equalized after removing the oxide film 7. Thereby the variation of the oxide film 5 in height in both the first region R1 and the second region R2 can be avoided. Again, the oxide film 7 has a lower etching rate with the chemical such as HF compared to that of the oxide film 7. Therefore, if the chemical such as HF is used to thin the oxide film 5, the oxide 7 is not etched.

Figure 10:
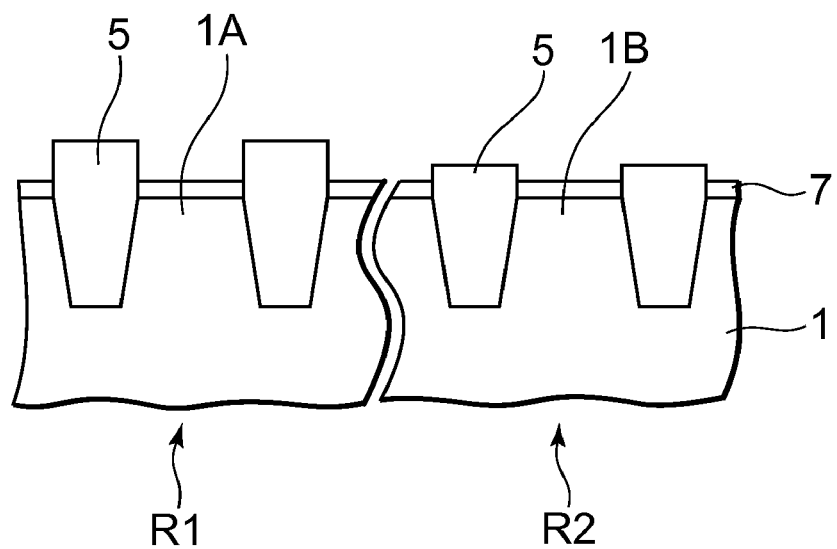

Next, as per FIG. 10, using a chemical such as SPM, the second resist pattern P2 is stripped by wet etching. Alternatively, APM can be used instead of the SPM. Since the oxide film 5 in the second region R2 is etched, the oxide film 5 in the first region R1 differs from those in the second region R2 in height. Thereby the oxide film 5 formed in the first region R1 is higher than those in the second region R2.

Figure 11:
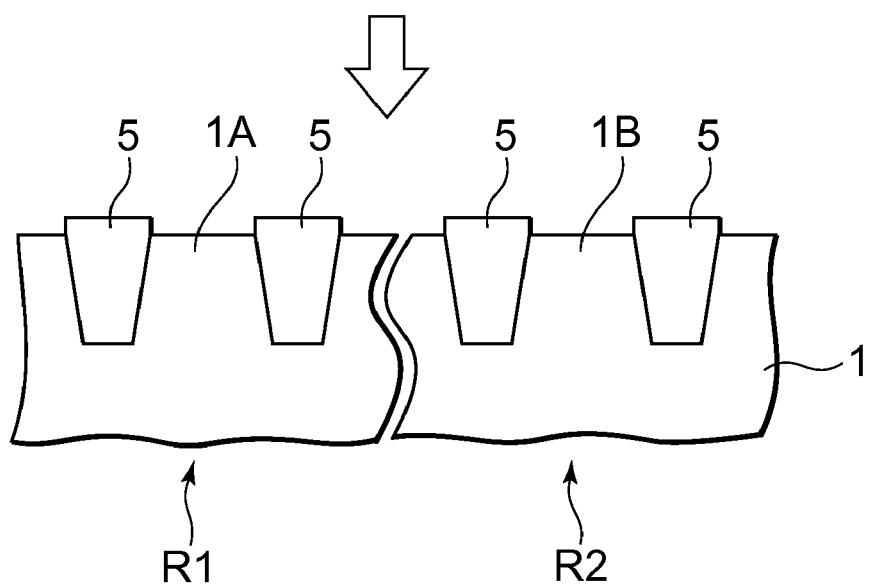

Then, as per FIG. 11, using the chemical such as HF, the oxide film 7 is removed by wet etching. In the wet etching, the oxide film 5 formed in the first region R1 and the second region R2 is etched at the different etching rates. In the first embodiment, since the oxide film 5 in the second region R2 is thinned preliminary in consideration of the difference between said etching rates, the oxide films 5 in both the first and second regions are equal in height after removing the oxide films 7. Thus, difference in height between the oxide films 5 in both first and second regions can be avoided.

Figure 12:
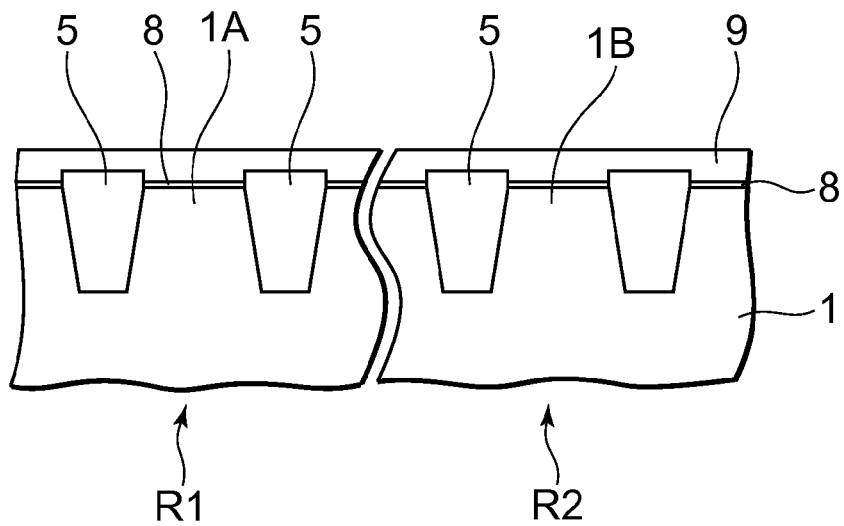

Then, as per FIG. 12, oxide films 8 are formed on the surfaces of the element regions 1A and 1B by the thermal CVD. A thickness of the oxide film 8 is defined as 1 nm here. Thereafter, a polysilicon film 9 is deposited over the oxide films 5 and the oxide films 8 by the CVD. A thickness of the polysilicon film 9 is defined as 100-150 nm here.

Figure 13:
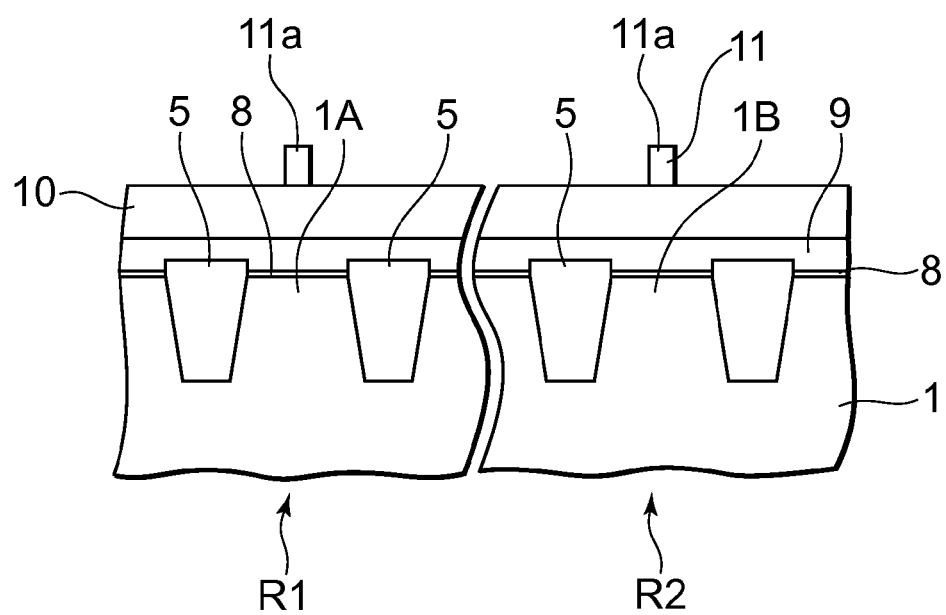

Next, as per FIG. 13, an antireflection film 10 and then a photoresist film 11 are coated on the surface of the polysilicon film 9 in sequence by the spin coating process. Thereafter, the photoresist film 11 is patterned and then resist pattern 11a is formed on the surface of the antireflection film 10.

Figure 14:
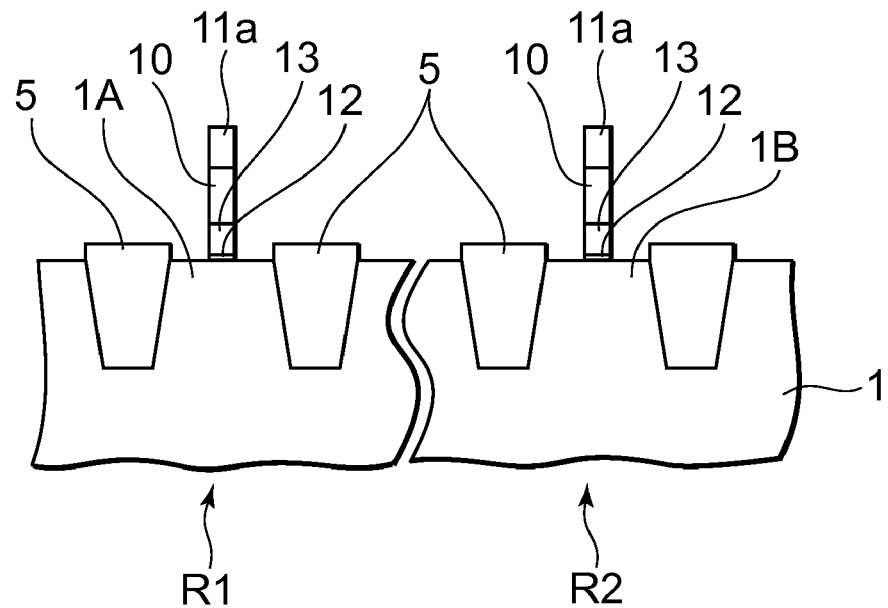

Then, as per FIG. 14, using the resist pattern 11a as a mask, the antireflection film 10, the polysilicon film 9 and the oxide films 8 are etched and then gate insulators 12 and gate electrodes 13 are formed on the element regions 1A and 1B. After forming the gate insulators 12 and the gate electrodes 13, the resist patterns 11a and the antireflection films 10 are removed.

Figure 15:
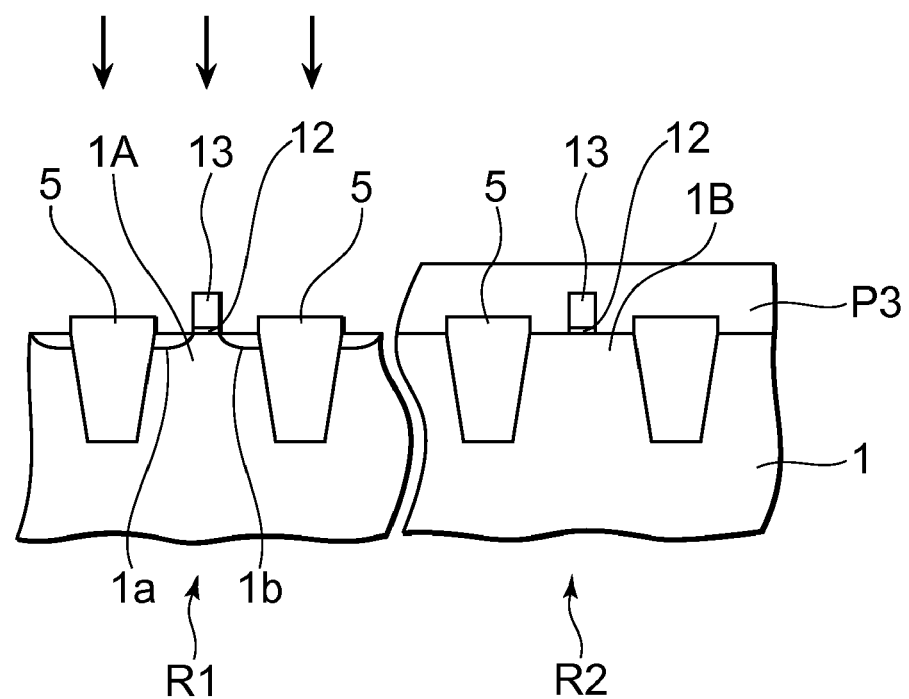

Next, as per FIG. 15, the third resist pattern P3 is formed by photolithography. The third resist pattern P3 exposes the first region R1 wherein the n-MOS transistor is formed and covers the second region R2 wherein the p-MOS transistor is formed. Using the gate electrodes 13 and the third resist pattern P3 as masks, ion doping is performed to form source extension regions 1a and drain extension regions 1b in the element region 1A formed in the first region R1, after which the third resist pattern P3 is removed with the chemical such as SPM.

Figure 16:
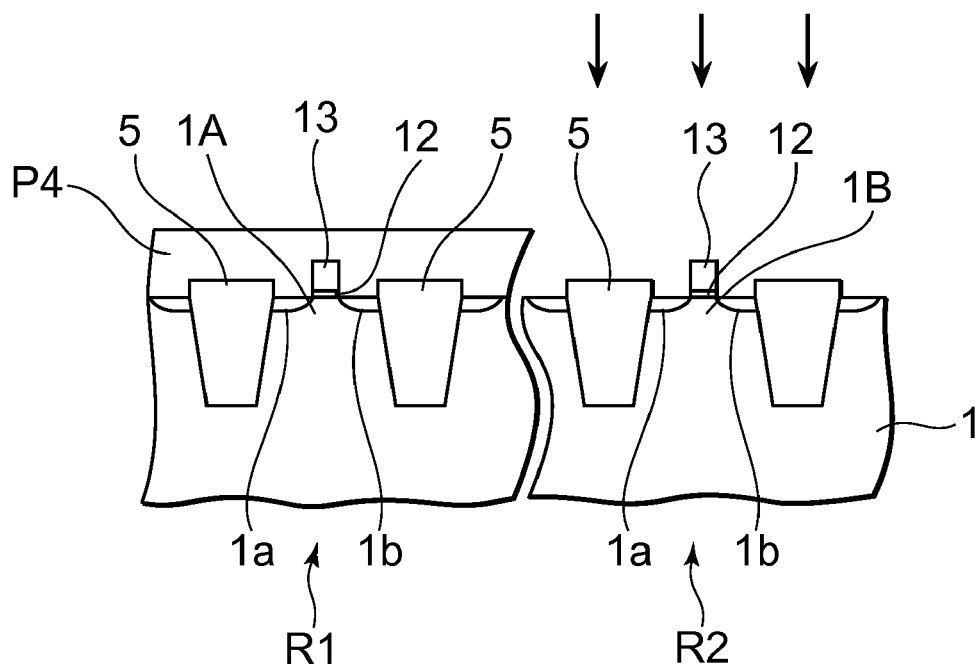

Next, as per FIG. 16, the fourth resist pattern P4 is formed by photolithography. The fourth resist pattern P4 covers the first region R1 wherein the n-MOS transistor is formed and exposes the second region R2 wherein the p-MOS transistor is formed. Using the gate electrodes 13 and the fourth resist pattern P4 as masks, ion doping is performed to form the source extension regions 1a and the drain extension regions 1b in the element region 1B formed in the second region R2, after which the fourth resist pattern P4 is removed with the chemical such as SPM.

Figure 17:
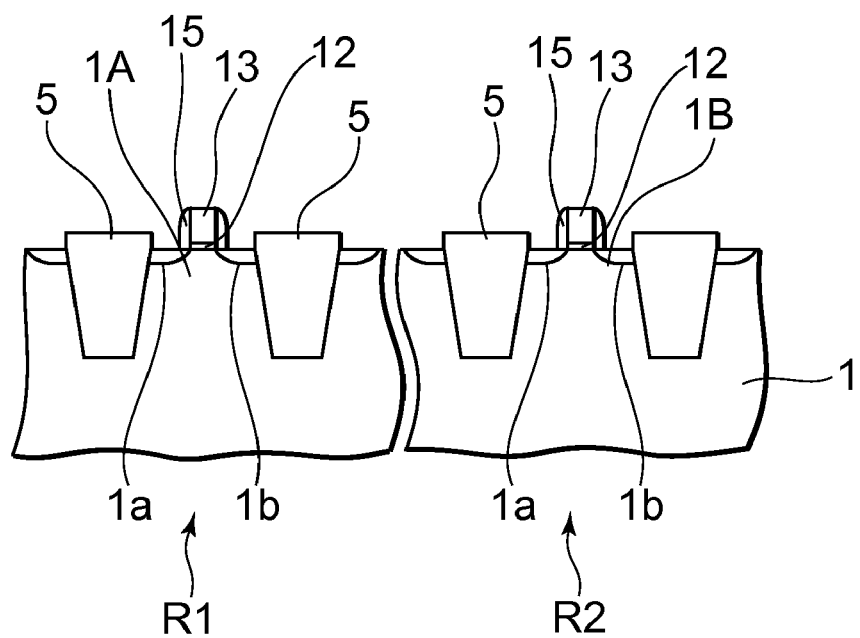

Then, as per FIG. 17, the oxidized silicon film is formed over the oxide films 5, the element region 1A/1B and the gate electrodes 13. Thereafter, the oxidized silicon film is etched anisotropically to form sidewall insulators 15 on both sides of the gate electrodes 13. The thickness of the sidewall insulator 15 is defined as 90 nm here.

Figure 18:
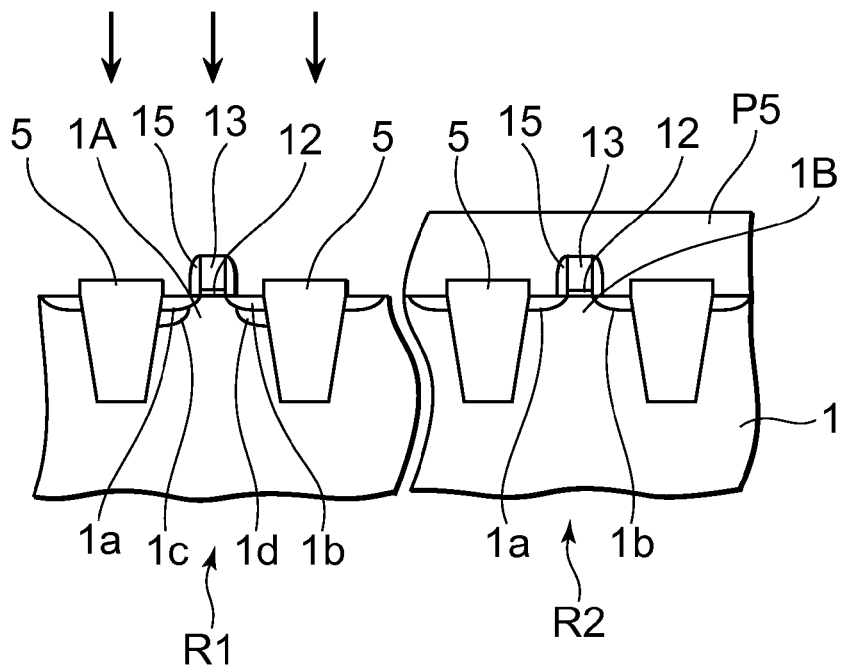

Next, as per FIG. 18, the fifth resist pattern P5 is formed by the photolithography method. The fifth resist pattern P5 exposes the first region R1 wherein the n-MOS transistor is formed and coats the second region R2 wherein the p-MOS transistor is formed. Using the gate electrodes 13, the sidewall insulators 15 and the fifth resist pattern P5 as masks, ion doping is performed to form source regions 1c and drain regions 1d in the element region 1A formed in the first region R1, after which the fifth resist pattern P5 is removed with the chemical such as SPM.

Figure 19:
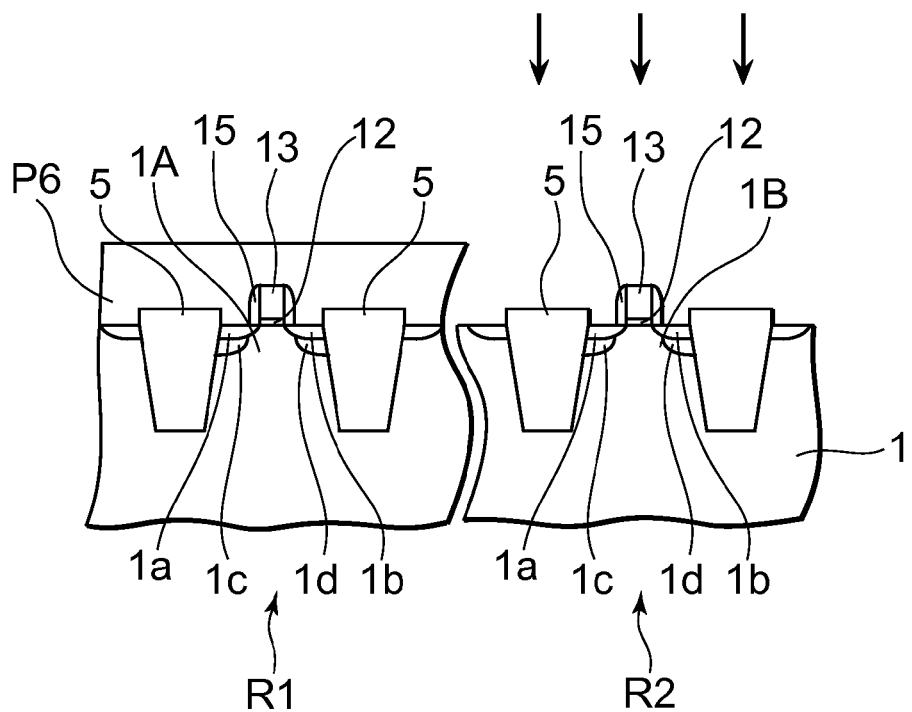

Then, as per FIG. 19, the sixth resist pattern P6 is formed by the photolithography method. The sixth resist pattern P6 covers the first region R1 wherein the n-MOS transistor is formed and exposes the second region R2 wherein the p-MOS transistor is formed. Using the gate electrodes 13, the sidewall insulators 15 and the sixth resist pattern P6 as masks, ion doping is performed to form the source regions 1c and the drain regions 1d in the element region 1B formed in the second region R2, after which the sixth resist pattern P6 is removed with the chemical solution such as SPM.

Figure 20:
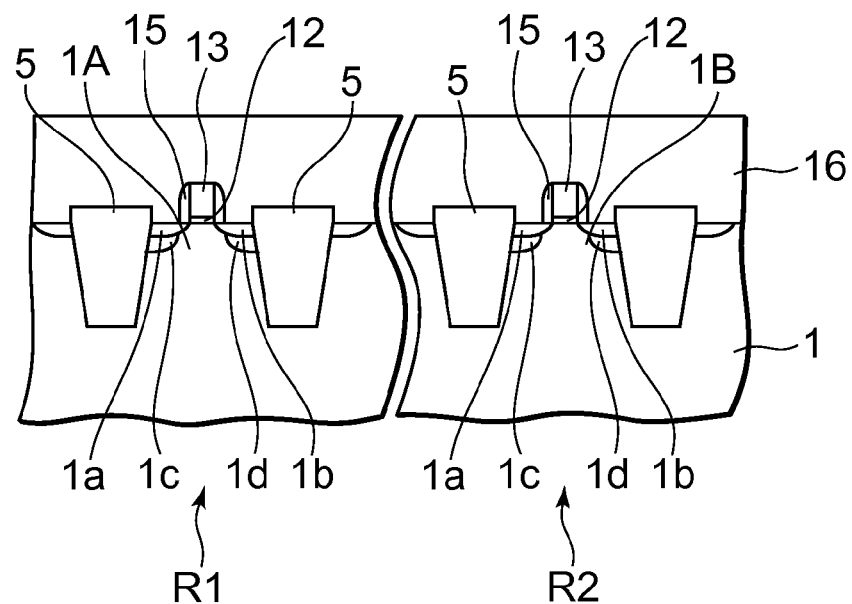

Then as per FIG. 20, an interlayer insulator 16 is deposited over the element regions 1A and 1B, the sidewall insulators 15 and the oxide films 5 by HDP-CVD.

Figure 21:
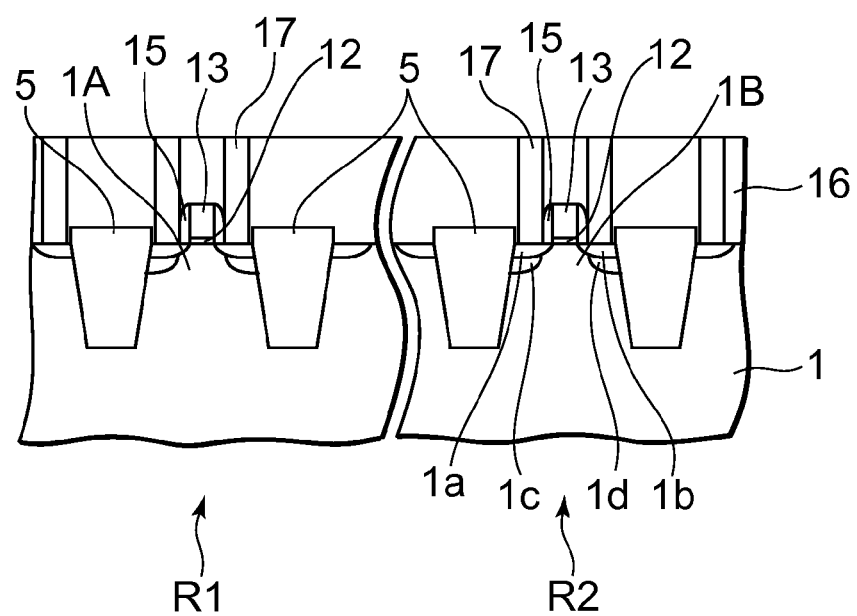

Next, as per FIG. 21, contact holes leading to the source regions 1c or the drain regions 1d are formed by the magnetron RIE (reactive ion etching) through the interlayer insulator 16. Then barrier metal such as TiN is filled within the contact holes by CVD. Thereafter, tungsten (W) is deposited on the barrier metal by CVD; thereby contacts made from tungsten (W) are buried inside of the contact hole. Thus contacts 17 electrically connected with the source regions 1c and the drain regions 1d are completed. As described above, the principle processes of the method of manufacturing the semiconductor device has finished.

As described above, inasmuch as the etching rate of the oxide film 5 rises with the chemical such as HF due to the ion implementation, the oxide films 5 formed in the second region R2 are preliminary thinned in the first embodiment. Therefore, where the oxide films 7 are removed with the chemical such as HF after the well/channel implementation, the difference in height between the oxide films 5 in the first region R1 and those in the second region R2 can be eliminated.

Conventionally, the antireflection film 10 is coated by spin coating. Thus, where the oxide films in the first region R1 and those in the second region R2 differ in height, the surface of the polysilicon film 9 deposited thereon becomes uneven, and hence the antireflection film 10 deposited thereon is uneven. Consequently, the pattern widths of the resist patterns 11a vary piece by piece, and thus line widths of the gate electrodes 13 vary piece by piece.

However, variation of the oxide films 5 in height between the first region R1 and the second region R2 is avoidable in the first embodiment, thus the overall surface of the polysilicon film 9 can be leveled roughly. Thus the thickness of the antireflection film 10 coated on the polysilicon film 9 becomes even, and therefore the line widths of the gate electrodes 13 can be even.

Figure 22:
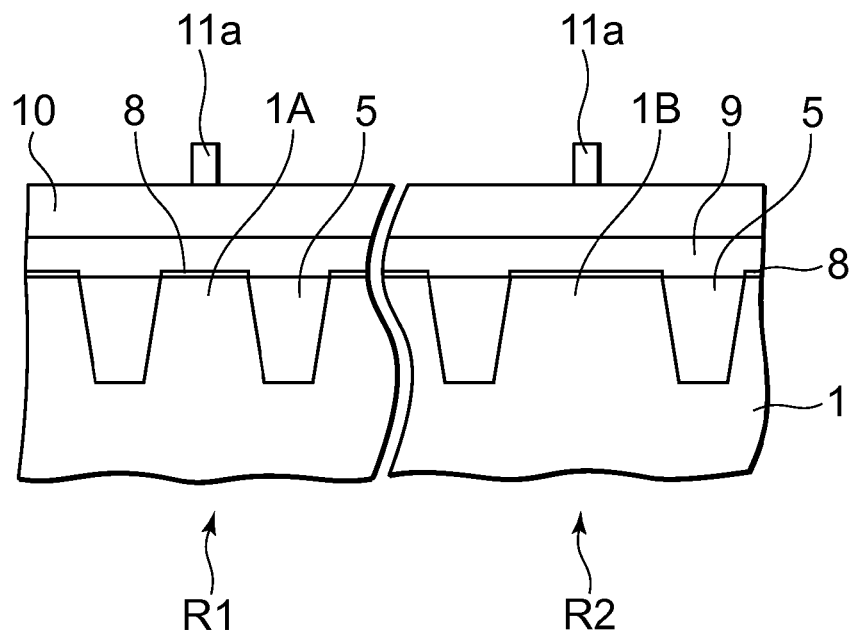
Figure 23:
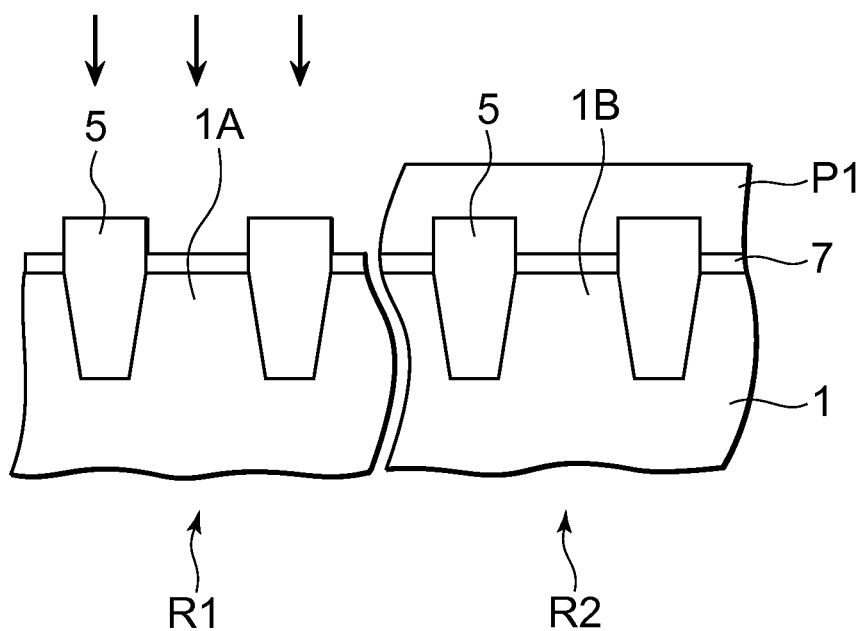
Figure 24:
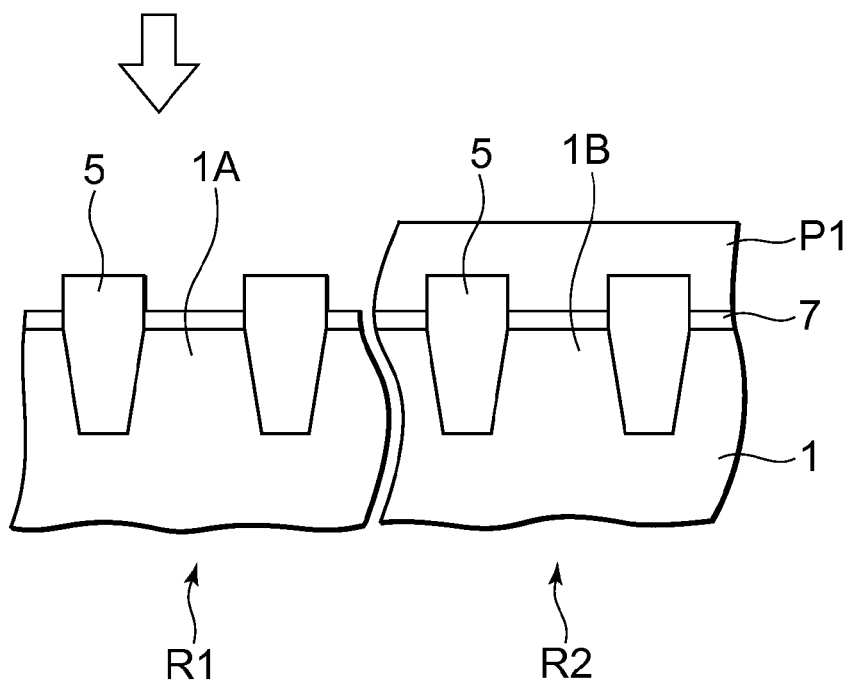

Further, since the unevenness in height between the oxide films 5 in the first region and the second region is avoidable, the difference in level between the element region 1A formed in the first region R1 and the oxide films 5 formed in the first region R1 and the difference between the element region 1B formed in the second region R2 and the oxide films 5 formed in the second region 1B can be eliminated simultaneously as per FIG. 22 by adjusting the thickness of the stopper film, i.e., the thickness of the silicon nitride film 3 in polishing the oxide films 5 (refer to FIG. 5).

For example, where the widths of the element regions 1A and 1B are different, even there is no difference in height between the oxide films 5 in the first region R1 and those in the second region R2, the thickness of the antireflection film 10 could become uneven due to the effect of a viscosity or wettability of the antireflection film 10. Hence, where there is no difference between the oxide films 5 in the first region R1 and those in the second region R2, the line width of the gate electrode 13 could not be even. However, with this embodiment, it is possible to eliminate the difference in height between the element region 1A and the oxide films 5 together with the difference between the element region 1B and the oxide films 5, so that the thickness of the antireflection film 10 can be even regardless of its viscosity or wettability, thereby the line width of the gate electrodes 13 is even.

In the first embodiment, having regard to the condition that the etching rate of the oxide film 5 formed in the first region R1 is greater than that of in the second region R2, the oxide films 5 formed in the second region R2 are thinned with the chemical solution such as HF prior to the elimination of the oxide films 7. However, when forming the p-MOS transistor in the first region R1 in conjunction with forming the n-MOS transistor in the second region R2, the etching rates of the oxide film 5 becomes adverse in the first region R1 and the second region R2. In other words, the etching rate of the oxide film 5 formed in the second region R2 becomes greater than that of in the first region R1. Thus, the oxide films 5 formed in the first region R1 should be thinned prior to removing the oxide film 7. In this regard, after the well and the channel implementations to the element region 1A formed in the first region R1 as per FIG. 23, the oxide films 5 formed in the first region R1 are etched using the first resist pattern P1 used in said well and channel implementations as a mask. In addition, a plurality of transistors can be formed in each region.

In the first embodiment, implementing two types of transistors, i.e., combined use of the n-MOS transistor and the p-MOS transistor, has been presented. However, where the type of ion, the accelerating voltage or dosage used in the well/channel implementation differ from the combination mentioned above, a combination of n-MOS transistor and n-MOS transistor, or p-MOS transistor and p-MOS transistor can be used, or further, three or more types of transistors can be used together.

Furthermore, where it is proven that the oxide films 5 formed in either of the first region R1 or the second region R2 are lower than the element region 1A or 1B, the oxide films 5 can be higher than the element region 1A or 1B, or the same by adjusting the thickness of the stopper film, i.e., the thickness of the silicon nitride film 3, in polishing the oxide films 5 (refer to FIG. 5). Thus, the upper portion of the element 1A and 1B, i.e., the surfaces of the element 1A, 1B and the ridges of the silicon trench 1T are covered with the oxide film 5 so that the deterioration of the transistor performance caused by leak current and so on can be prevented.

Alternative Example 1 of the First Embodiment

As previously described, in the first embodiment, the oxide films 5 formed in the first region R1 or the second region R2 are etched by using the chemical solution such as HF after completing the well/channel implementation to either the first region R1 or the second region R2. However, for example, the oxide films 5 can be etched using chemical solution such as HF after completing both well and channel implementations to both first region R1 and second region R2.

Figure 25:
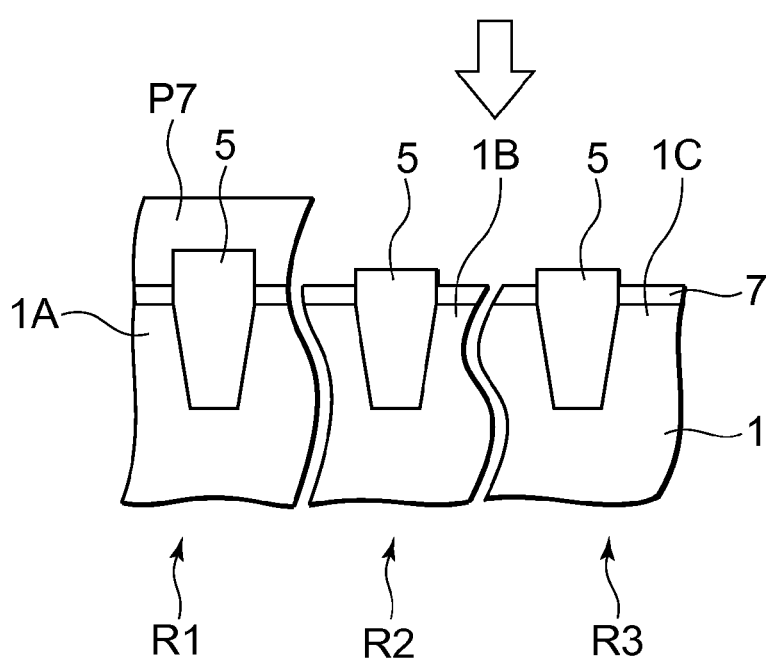
FIGS. 25-32 are illustrations showing the process of manufacturing the semiconductor device in a variation of the first embodiment.
Figure 26:
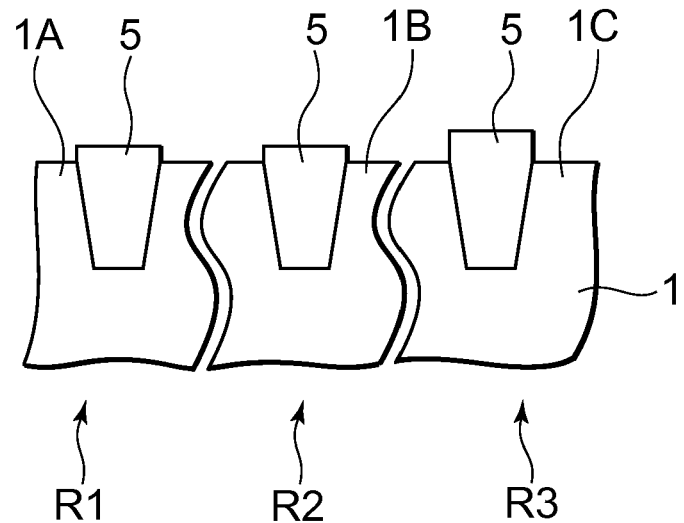
Figure 27:
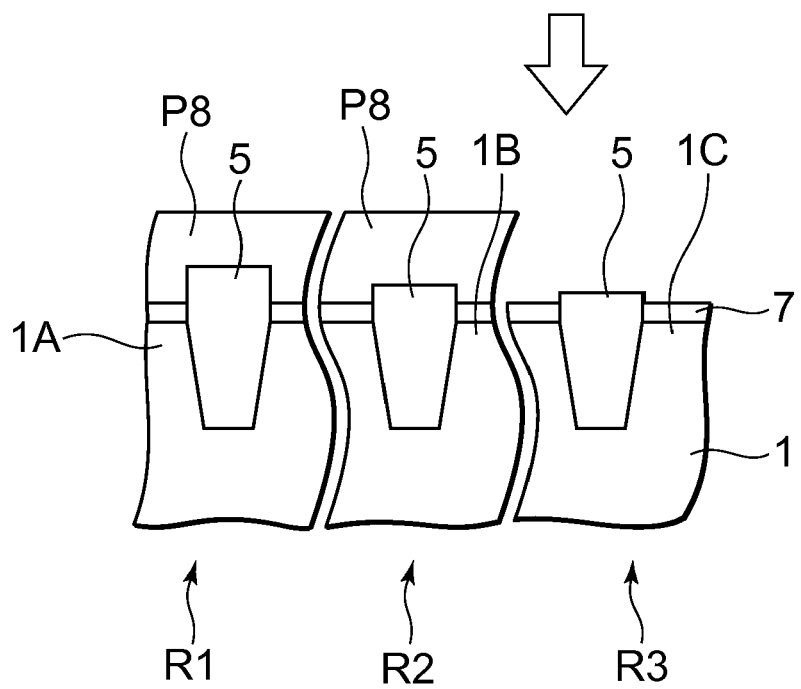
Figure 28:
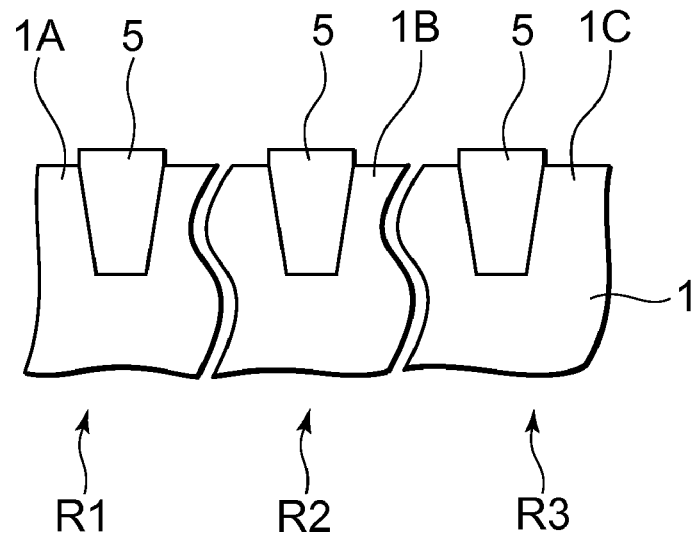

Hereinafter, forming three types of transistors, i.e., the $1^{st}$-$3^{rd}$ transistors, on the silicon substrate 1 in this variation will be discussed. In FIG. 25-28, the code R3 denotes the third region wherein the third transistor is formed and the code 1C denotes an element region formed in said third region R3.

Where the prior embodiment illustrates that "when the oxide films 7 are removed with chemical solution such as HF, the oxide films 5 formed in the first region R1 are etched by α and the oxide films 5 formed in the second region R2 are etched β(<α) and the oxide films 5 formed in the third region R3 are etched γ(<β), as per FIG. 25, firstly the seventh resist pattern P7 is formed by the lithography method. The seventh resist pattern P7 covers the first region R1, and exposes the second region R2 and the third region R3. Using the seventh resist pattern P7 as a mask, the oxide films 5 formed in the second region R2 and the third region R3 are etched by α-β. Thus, the heights of the oxide films 5 in both first region R1 and second region R2 can be equalized after removing the oxide films 7 as per FIG. 26. The seventh resist pattern P7 is an inversion pattern of the first resist pattern P1 used in the well implementation and the channel implementation to the first region R1. Thus where using the resist material of the first resist pattern P1 as negative resist and the resist material of the seventh resist pattern P7 as a positive resist, or conversely, the resist material of the first resist pattern P1 as a positive resist and the resist material of the seventh resist pattern P7 as a negative resist, the first resist pattern P1 and the seventh pattern P7 can be formed by using a common reticle.

Yet thinning the oxide films 5 formed in the second region R2 and the third region R3 by α-β, the oxide films 5 in the first region R1, the second region R2 and the third region R3 could differ in height significantly after removing the oxide films 7. In such case, the eighth resist pattern P8 can be formed by the lithography method as per FIG. 27 if needed. The eighth resist pattern P8 covers the first and the second region R1 and R2 and exposes only the third region R3. Then using the eighth resist pattern P8 as a mask, the oxide film formed in the third region R3 is etched by α-β-γ using the chemical solution such as HF. With this approach, the oxide films 5 formed in the first, second and third region (R1, R2 and R3) can be equalized in height as per FIG. 28.

In this variation, the oxide films 5 are etched with the chemical solution such as HF before removing the oxide films 7, however, for example, after removing the oxide films 7, the oxide films 5 can be etched using the chemical solution such as HF.

Alternative Example 2 of the First Embodiment

As described above, in the first embodiment, the thickness of the gate insulator of the n-MOS transistor and that of the gate insulator of the p-MOS transistor is equal. Thus, the gate insulators can be formed simultaneously in the element region 1A formed in the first region R1 and the element region 1B formed in the second region R2. However, where forming a high-voltage-resistant transistor in any of the first, second or third region (R1, R2 or R3) and forming low-voltage-resistant transistors (core transistor) in other regions, the thicknesses of the gate insulators in the first region R1 and the second region R2 could differ. The gate insulator of the high-voltage-resistant transistor is thicker than that of the low-voltage-resistant transistor, so that where implementing both low-voltage- and high-voltage-resistant transistors, the gate insulators should be formed respectively in the first region R1 and the second region R2.

Hereinafter, forming the low-voltage-resistant transistor in the first region R1 and the high-voltage-resistant transistor in the second region R2, i.e., forming multigate transistors will be described.

Figure 29:
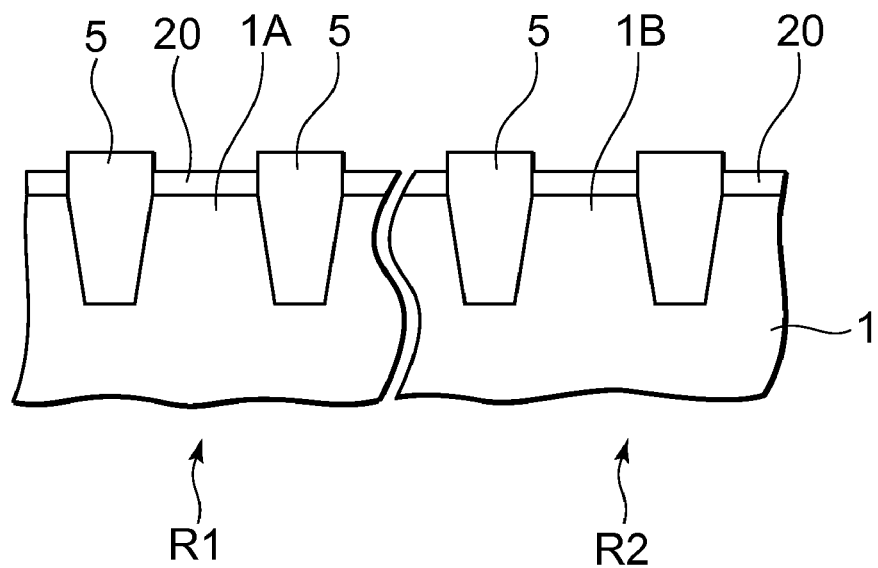

After removing the oxide films 7 formed in the element regions 1A and 1B, as per FIG. 29, silicon oxide films 20 are formed on the element region 1A existing in the first region R1 and the element region 1B existing in the first region R2. The thickness of the silicon oxide films 20 should be the same thickness of the gate insulator of the high-voltage-resistant transistor formed in the second region R2. Here, the thickness of the gate insulator of the high-voltage-resistant transistor is defined as 10 nm.

Figure 30:
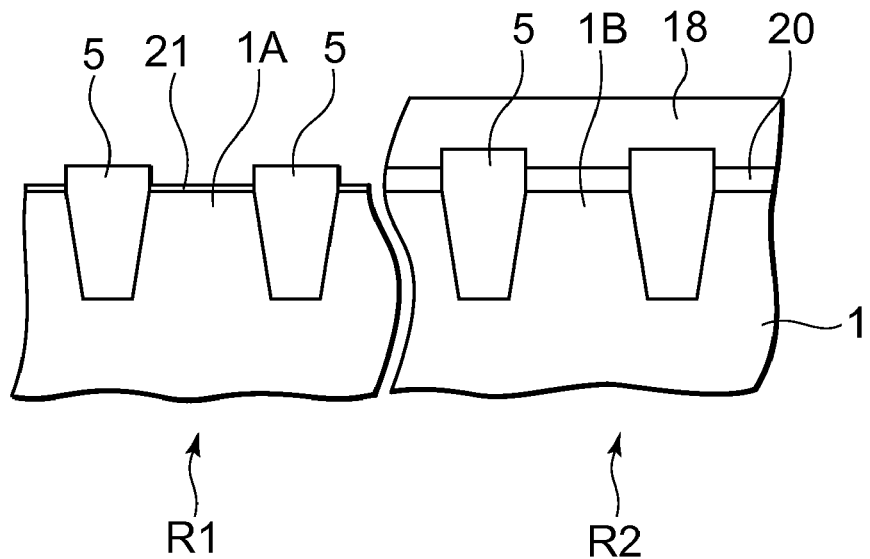

Then, as per FIG. 30, the second region R2 is covered with a resist 18, and then the silicon oxide films 20 formed in the first region R1 are removed by wet etching using the chemical solution such as HF. Thereafter, using the resist 18 as a mask, silicon oxide films 21 are formed in the element region 1A existing in the first region R1. The thickness of the silicon oxide films 21 is the same thickness of the gate insulator film of the low-voltage-resistant transistor formed in the first region R1. Here, the thickness of the gate insulator of the low-voltage-resistant transistor is defined as 1 nm.

As describe above, to form the low-voltage-resistant transistor in the first region R1 and the high-voltage-resistant transistor in the second region R2, the number of the etchings with the chemical solution of the first region R1 differs from that of the second region. Hence, the oxide films 5 formed in the first region R1 wherein the low-voltage-resistant transistor is formed will be thinner than the oxide films 5 formed in the second region R2 wherein the high-voltage-resistant transistor is formed by the number of the chemical etching of the silicon oxide films 20. In other words, the oxide films 5 formed in the first region R1 is thinner than those in the second region R2 by one chemical etching with HF. Thus, even where the oxide films 5 in both first region R1 and second region R2 are equal in height at the time when the silicon oxide films 20 are formed as per FIG. 29, the oxide films 5 have a variation in height as per FIG. 30 after completing the gate insulators for the low- and high-voltage-resistant transistors.

Figure 31:
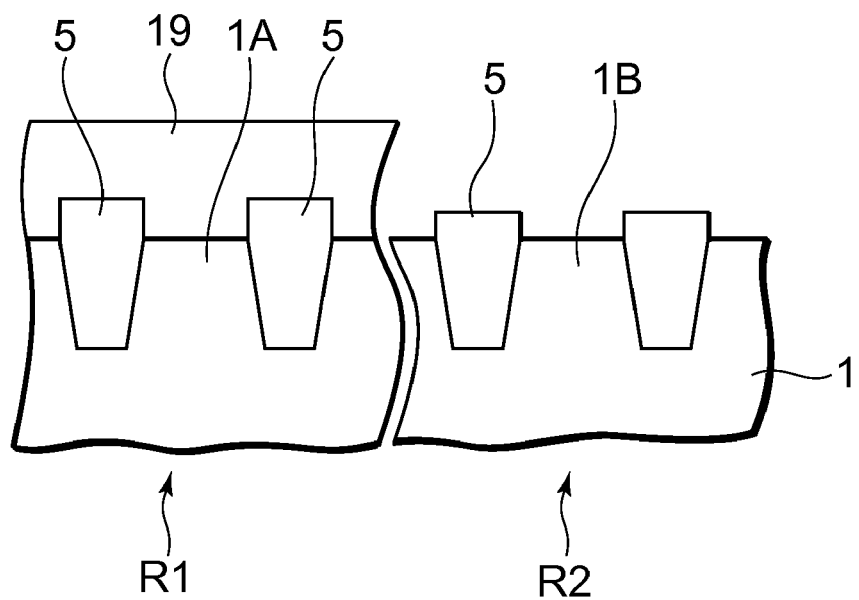
Figure 32:
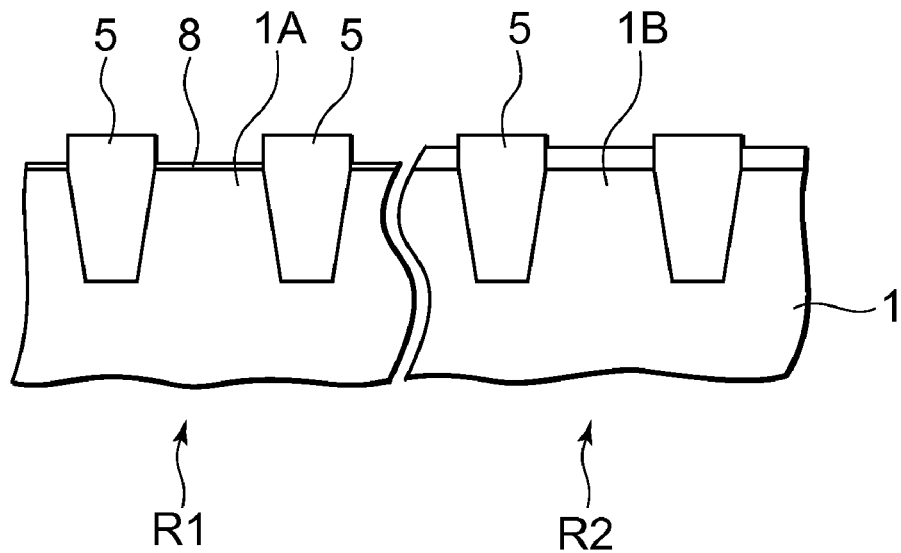
Figure 33:
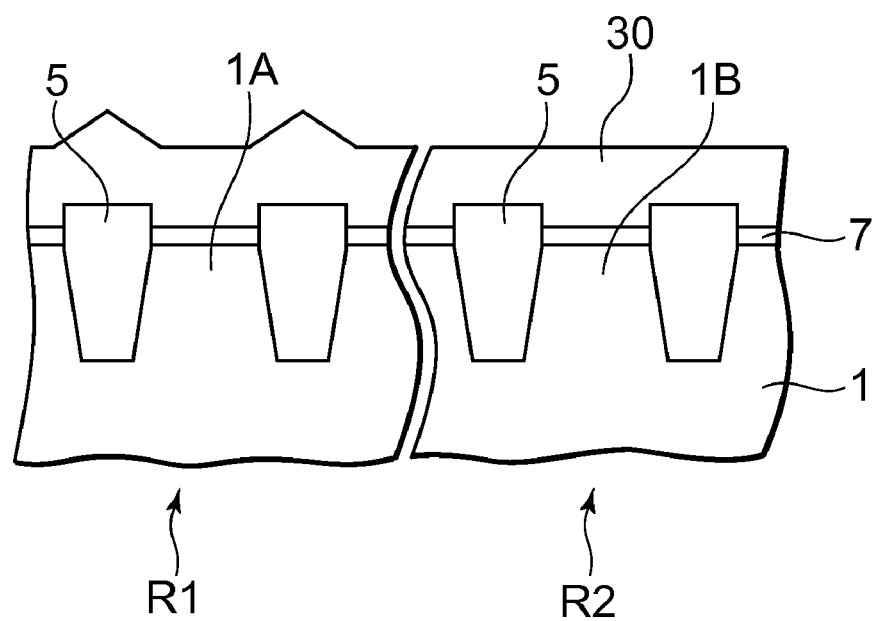
FIGS. 33-41 are illustrations showing the process of manufacturing the semiconductor device in a variation of the second embodiment.

For that reason, as per FIG. 31, prior to forming the silicon oxide films 20, the first region R1 wherein the low-voltage-resistant transistor is formed is covered with a resist pattern 19, then the oxide films 5 formed in the second region R2 is etched using the chemical solution such as HF. For example, where the condition that the oxide films 5 formed in the first region R1 are etched by 5 by one chemical etching using the chemical solution such as HF, then the oxide films 5 formed in the second region R2 are etched by 5 preliminary. Thus, where the chemical solution such as HF is provided onto the first region R1 in the forming process of the low- and high-voltage-resistant transistors, the difference of the oxide films 5 in the first region R1 and the second region R2 in height can be avoidable as per FIG. 32. Therefore, the oxide films 5 are etched preliminary inasmuch as that the number of times of chemical etching using HF to the first region R1 is different from that to the second region in this example.

A Second Embodiment

[Method of Manufacturing a Semiconductor Device in the Second Embodiment]

Referring to FIG. 33-41, the method of manufacturing the semiconductor device in the second embodiment will be discussed concretely. After finishing the well and the channel implementations to the element regions 1A and 1B formed in the first region R1 and the second region R2 respectively, oxide film 30 is deposited over the oxide films 5 and the oxide films 7 by the HDP-CVD as per FIG. 33. The thickness of the oxide film 30 is defined as 100-200 nm here. In the second embodiment, the oxide film 30 is used, however, TEOS (tetra ethyl ortho silicate) can be used as an alternative.

Figure 34:
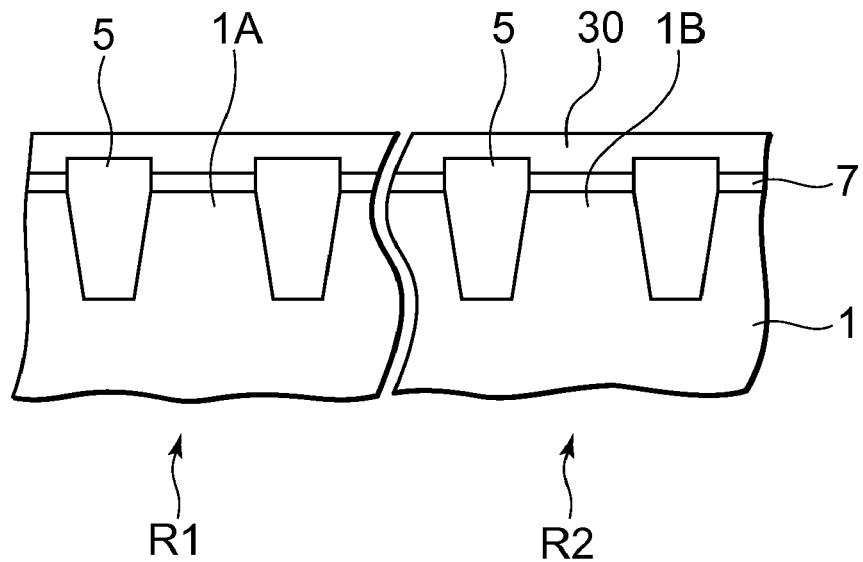

Next, as per FIG. 34, the oxide film 30 is polished to the thickness of approximately 50-100 nm, to level its surfaces.

Figure 35:
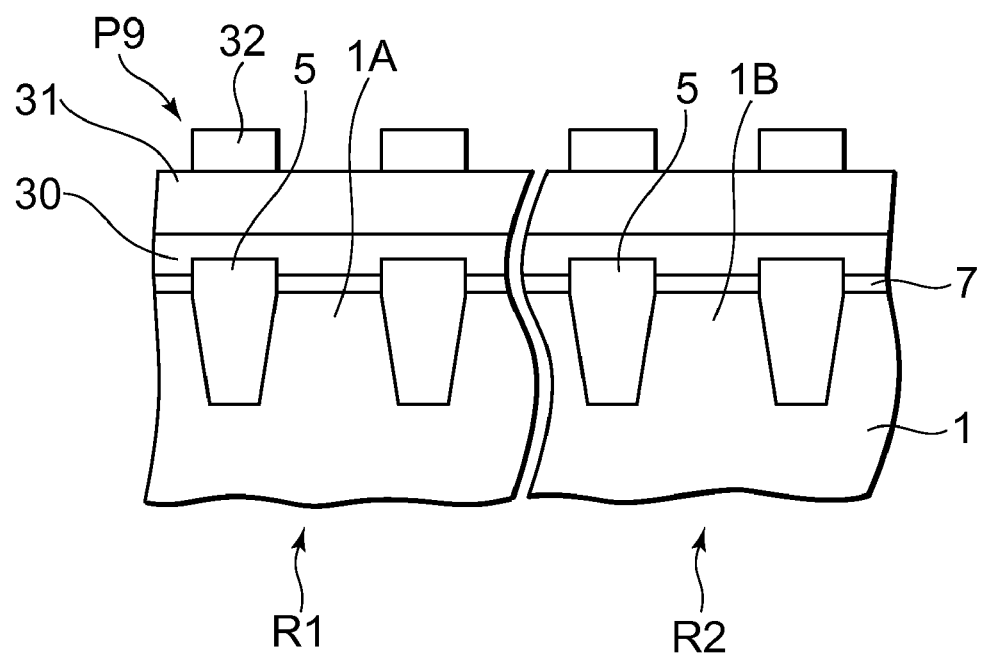

Then, as per FIG. 35, an antireflection film 31 and then photoresists 32 are coated on the surface of the oxide film 30 by the spin coating. Thereafter, patterning the photoresists 32 by the photolithography method, the ninth resist pattern P9 is formed on the antireflection film 31. The ninth resist pattern P9 exposes the regions where the element regions 1A and 1B exist, and covers the regions where the oxide films 5 exist.

Figure 36:
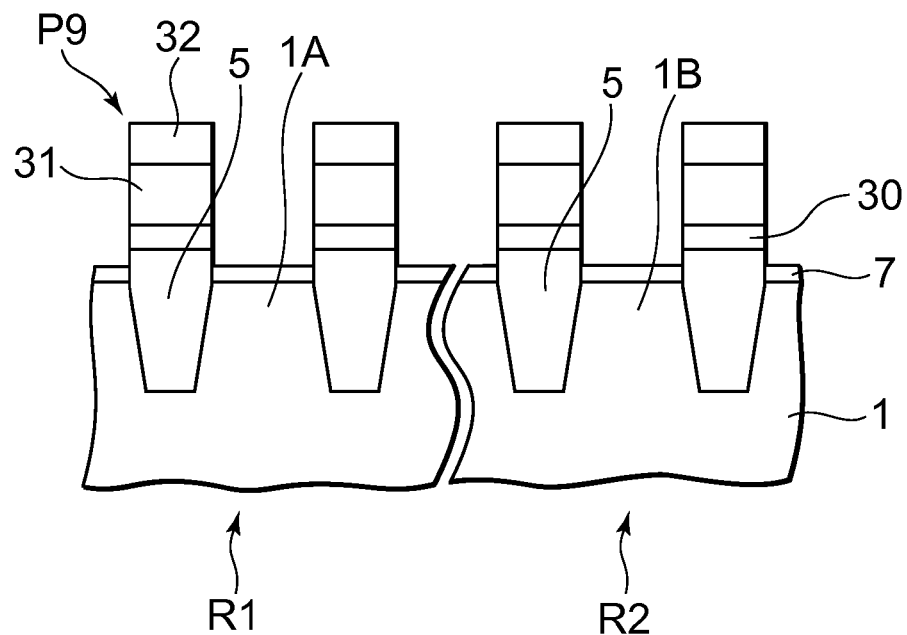
Figure 37:
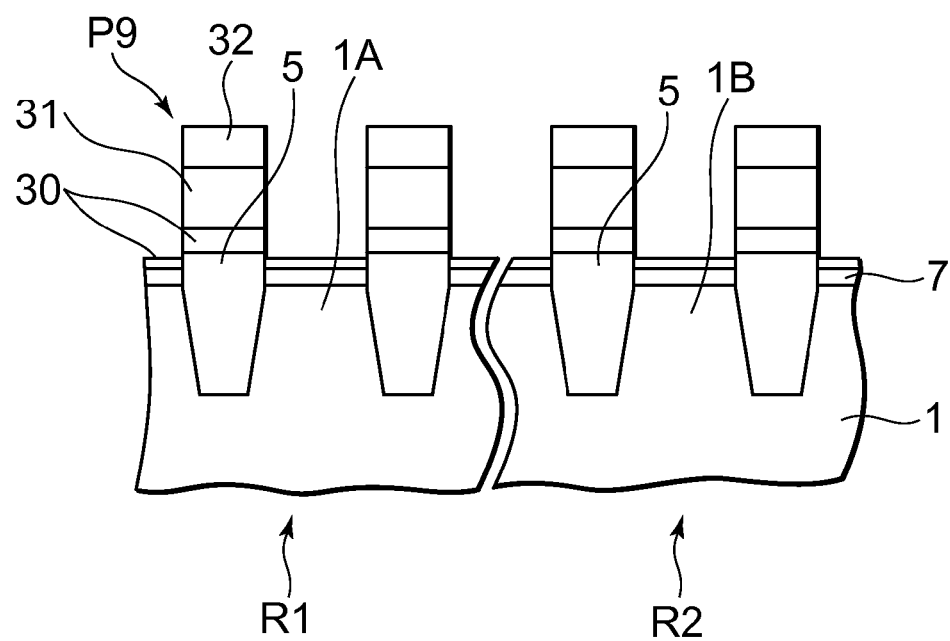
Figure 38:
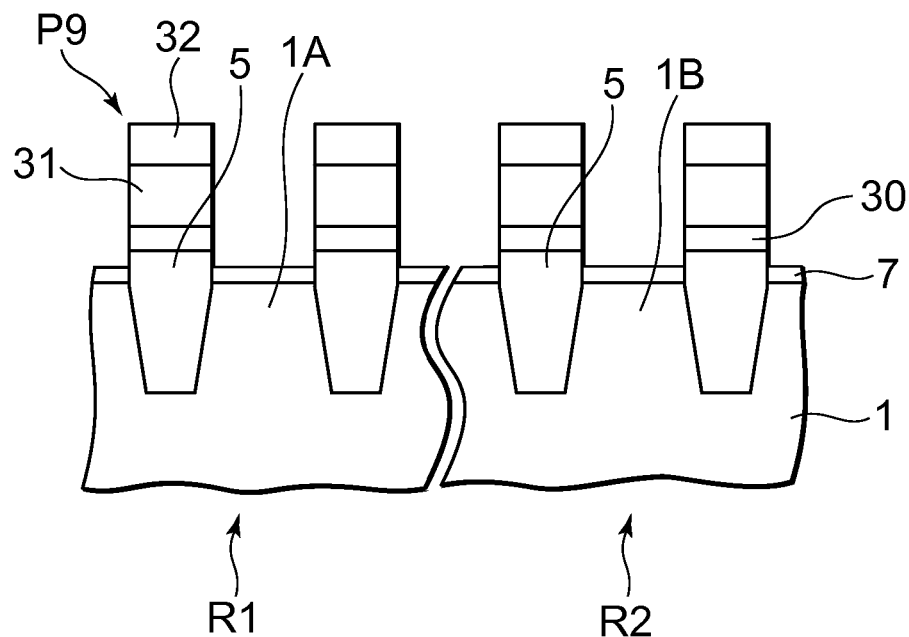

Thereafter, as per FIG. 36, using the ninth resist pattern P9 as a mask, the antireflection film 31 and the oxide film 30 are removed by the dry etching. Thus, the surfaces of the oxide films 7 are exposed. In the second embodiment, the dry etching is used to expose the surfaces of the oxide films 30. However, alternatively, the wet etching can be used in conjunction with the dry etching. Thus, as per FIG. 37, the oxide film 30 deposited on the oxide films 7 can be etched to the thickness of approximately 10-30 nm by the dry etching and then the residual oxide film 30 on the surfaces of oxide films 7 can be removed by the wet etching using the chemical solution such as HF as per FIG. 38. After exposing the oxide films 7, the ninth resist pattern P9 and the antireflection film 31 can be removed.

Figure 39:
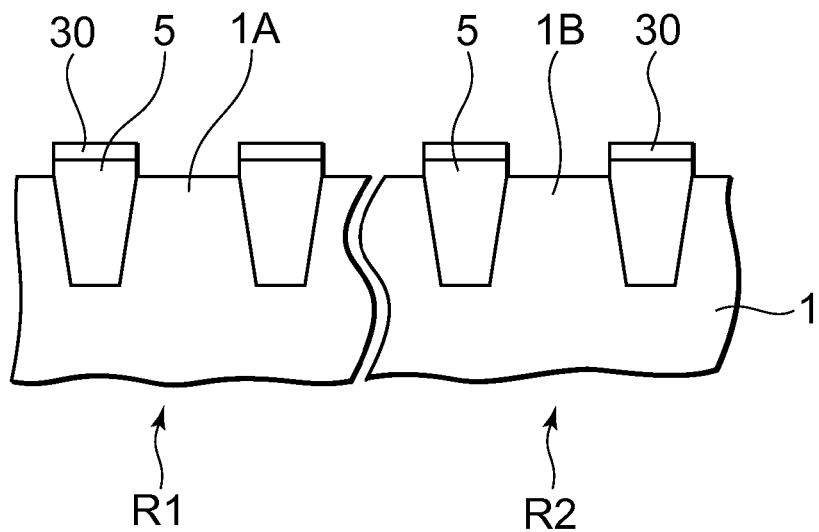

Then, as per FIG. 39, the oxide films 7 are removed by the wet etching using the chemical solution such as HF. In this process, the oxide film 30 deposited over the oxide films 5 are etched due to the wet etching. However, the oxide film 30 is formed after the well/channel implementation so that the etching rates of the oxide film 30 are equal in the first region R1 and the second region R2. Thus, when the chemical solution such as HF is used to remove the oxide films 7 after the well/channel implementation, the oxide film 30 is level in both first and second region (R1 and R2).

In the second embodiment, the case is where the surfaces of the oxide films 5 are higher than those of the element regions 1A and 1B at the point of removing the oxide films 7.

Figure 40:
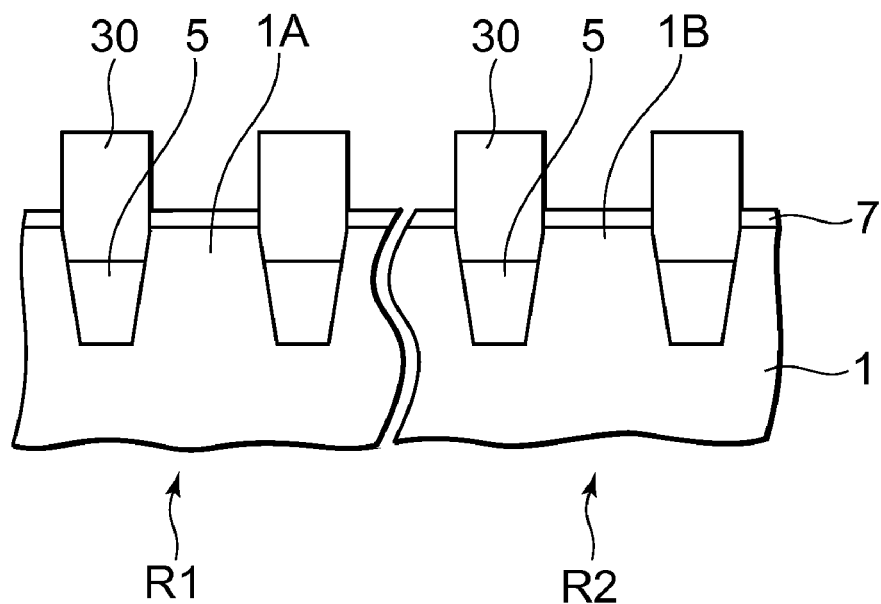
Figure 41:
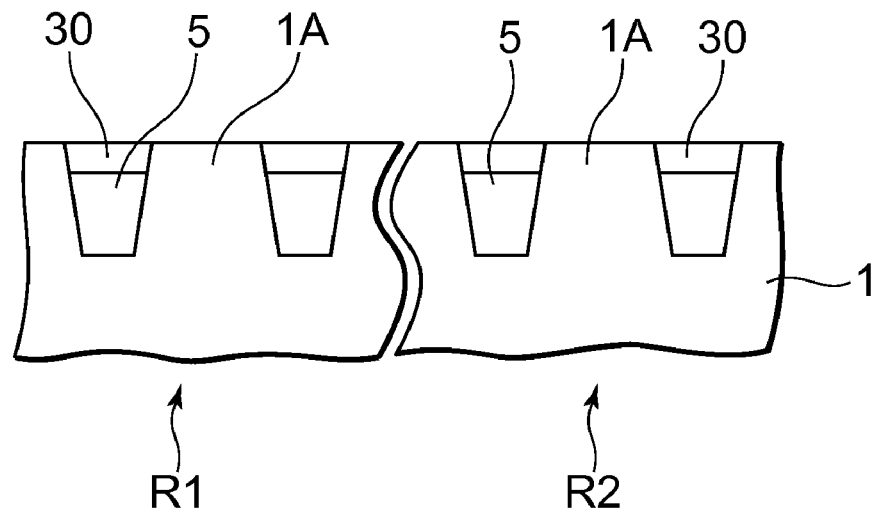

However for example, as per FIG. 40, the surfaces of the oxide films 5 can be lower than those in the element regions 1A and 1B at the point of removing the oxide films 7. If the surfaces of the oxide films 5 are lower than those of the element regions 1A and 1B, the etching rates of the oxide film 30 in the first region R1 and the second region R2 are the same even where the oxide film 30 is etched to the same height of the surfaces of the element regions 1A and 1B. Therefore, as per FIG. 41, the difference between the element region 1A formed in the first region R1 and the oxide films 5 formed in the first region R1 can be readily eliminated together with the difference between the element region 1B formed in the second region R2 and the oxide films 5 formed in the second region R2. Furthermore, the oxide film 30 covers the surfaces of the element regions 1A and 1B, the deterioration of the transistors performances such as leak current can be avoided. With the method described above, in the second embodiment, the two types of the oxide films are deposited within the trench 1T, viz., the oxide films 5 and the oxide films 30 having the lower ion concentration compared to the oxide film 5 bury the trench 1T.

What is claimed is:

1. A method of manufacturing a semiconductor device, comprising:
    forming a trench on a semiconductor substrate to define a first element region and a second element region;
    burying a first oxide film in said trench;
    forming a second oxide film on surfaces of said first and second element regions;
    performing a first ion doping through the second oxide film into the semiconductor substrate using a first mask which is exposing a first region containing said first element region and a part of said first oxide film;
    performing a second ion doping through the second oxide film into the semiconductor substrate using a second mask which is exposing a second region containing said second element region and a part of said first oxide film;
    after performing the first ion doping and the second ion doping, removing said second oxide film formed in said first element region and said second element region by etching,
    after removing said second oxide film, forming an insulator film on said first and second element regions;
    forming a conductive film on said insulator film; and
    forming a gate electrode of a transistor by patterning said conductive film;
    wherein said first oxide film in said second region is selectively thinned using said second mask so that an upper surface of said first oxide film in said second element region is lower than an upper surface of said first oxide film in the first element region and is higher than a surface of said semiconductor substrate, after performing said first or second ion doping and before removing said second oxide film.

2. The method of manufacturing the semiconductor device according to claim 1, wherein;
    patterning said conductive film includes:
    forming an antireflection film on said conductive film by coating;
    forming a resist film on said antireflection film;
    patterning said resist film by photolithography; and etching said antireflection film and said conductive film using said resist film as a mask.

3. The method of manufacturing the semiconductor device according to claim 1, wherein:

said first oxide film is formed by chemical vapor deposition; and said second oxide film is formed by thermal oxidation method.

4. The method of manufacturing the semiconductor device according to claim 1, wherein:

a chemical solution including HF is used for removing said second oxide film.

\* \* \* \* \*